(12) United States Patent
Podell

(10) Patent No.: US 9,966,646 B1
(45) Date of Patent: May 8, 2018

(54) COUPLER WITH LUMPED COMPONENTS

(71) Applicant: Werlatone, Inc., Brewster, NY (US)

(72) Inventor: Allen F. Podell, Palo Alto, CA (US)

(73) Assignee: Werlatone, Inc., Brewster, NY (US)

( * ) Notice: Subject to any disclaimer, the term of this patent is extended or adjusted under 35 U.S.C. 154(b) by 0 days. days.

(21) Appl. No.: 15/591,516

(22) Filed: May 10, 2017

(51) Int. Cl.
*H01P 5/18* (2006.01)
*H01F 38/14* (2006.01)
*H03H 7/09* (2006.01)

(52) U.S. Cl.
CPC ............. *H01P 5/184* (2013.01); *H01F 38/14* (2013.01); *H01P 5/18* (2013.01); *H03H 7/09* (2013.01)

(58) Field of Classification Search
CPC ... H01P 5/18; H01P 5/184; H03H 7/09; H01F 38/14
USPC .................. 333/109–114, 177; 336/145, 147
See application file for complete search history.

(56) References Cited

U.S. PATENT DOCUMENTS

| | | | |
|---|---|---|---|
| 5,982,252 A | 11/1999 | Werlau | |
| 6,246,299 B1 | 6/2001 | Werlau | |
| 6,972,639 B2 | 12/2005 | Podell | |
| 7,042,309 B2 | 5/2006 | Podell | |
| 7,132,906 B2 | 11/2006 | Podell | |
| 7,138,887 B2 | 11/2006 | Podell | |
| 7,190,240 B2 | 3/2007 | Podell | |
| 7,202,760 B2 | 4/2007 | Podell | |
| 7,245,192 B2 | 7/2007 | Podell | |
| 7,345,557 B2 | 3/2008 | Podell | |
| 7,821,352 B1 | 10/2010 | Sanvoravong et al. | |
| 8,248,181 B2 | 8/2012 | Podell | |
| 8,487,716 B1 | 7/2013 | Podell et al. | |
| 8,542,080 B2 | 9/2013 | Podell | |
| 8,704,611 B2 | 4/2014 | Podell et al. | |
| 2009/0195324 A1* | 8/2009 | Li | H01F 19/04 333/25 |
| 2012/0256700 A1 | 10/2012 | Podell | |
| 2016/0218410 A1* | 7/2016 | Ootsuka | H01P 5/184 |

OTHER PUBLICATIONS

Robert Torsiello et al., A Practical Approach to a Compact, Wide-Band SMT Directional Coupler, Article from High Frequency Electronics, Feb. 2008, 3 pages.

* cited by examiner

*Primary Examiner* — Rakesh Patel

(74) *Attorney, Agent, or Firm* — Kolisch Hartwell, P.C.

(57) ABSTRACT

A coupled-line coupler having a coil in one of the coupled lines may include first and second conductors having at least first and second coupled sections in which the first and second conductors are closely coupled. A coil extending around an axis may be formed in the first conductor. At least a portion of the coil may be between the first and second coupled sections. A first portion of the first conductor may cross over a second portion of the first conductor when viewed along the axis. At least a first capacitor may be connected between a circuit ground and the first conductor at a position of the coil between and spaced from the first and second coupled sections.

24 Claims, 5 Drawing Sheets

COUPLER WITH LUMPED COMPONENTS

FIELD

This disclosure relates to coupled-line couplers. More specifically, the disclosed embodiments relate to coupled-line couplers in which at least one conductor includes a coil spaced from the other conductor.

INTRODUCTION

A pair of conductive lines are coupled when they are spaced apart, but spaced closely enough together for energy flowing in one to be induced in the other. The amount of energy flowing between the lines is related to the dielectric medium the conductors are in and the spacing between the lines. Even though electromagnetic fields surrounding the lines are theoretically infinite, lines are often referred to as being closely or tightly coupled, loosely coupled, or uncoupled, based on the relative amount of coupling.

Couplers are electromagnetic devices formed to take advantage of coupled lines, and may have four ports, one for each end of two coupled lines. A main line has an input connected directly or indirectly to an input port. The other end is connected to the direct or transmitted port. The other or auxiliary line extends between a coupled port and an isolated port. A coupler may be reversed, in which case the isolated port becomes the input port and the input port becomes the isolated port. Similarly, the coupled port and direct port have reversed designations.

Directional couplers are four-port networks that may be simultaneously impedance matched at all ports. Power may flow from one or the other input port to the pair of output ports, and if the output ports are properly terminated, the ports of the input pair are isolated. A hybrid is generally assumed to divide its output power equally between the two outputs, whereas a directional coupler, as a more general term, may have unequal outputs. Often, the coupler has very weak coupling to the coupled output, which minimizes the insertion loss from the input to the main output. One measure of the quality of a directional coupler is its directivity, the ratio of the desired coupled output to the isolated port output.

Adjacent parallel transmission lines couple both electrically and magnetically. The coupling is inherently proportional to frequency, and the directivity can be high if the magnetic and electric couplings are equal. Longer coupling regions increase the coupling between lines, until the vector sum of the incremental couplings no longer increases, and the coupling will decrease with increasing electrical length in a sinusoidal fashion. In many applications it is desired to have a constant coupling over a wide band. Symmetrical couplers exhibit inherently a 90-degree phase difference between the coupled output ports, whereas asymmetrical couplers have phase differences that approach zero-degrees or 180-degrees.

Unless ferrite or other high permeability materials are used, greater than octave bandwidths at higher frequencies are generally achieved through cascading couplers. In a uniform long coupler the coupling rolls off when the length exceeds one-quarter wavelength, and only an octave bandwidth is practical for +/−0.3 dB coupling ripple. If three equal length couplers are connected as one long coupler, with the two outer sections being equal in coupling and much weaker than the center coupling, a wideband design results. At low frequencies all three couplings add. At higher frequencies the three sections can combine to give reduced coupling at the center frequency, where each coupler is one-quarter wavelength. This design may be extended to include many sections to obtain a very large bandwidth.

A coupler including first and second conductive lines forming at least first and second coupled sections and a delay section between the first and second coupled sections may have reduced length. A coupler unit, which includes a coupled section and an adjacent delay section, has an effective electrical length equal to the sum of the electrical lengths of the two lines in the coupled section and the lengths of the lines in the delay section. The electrical length is defined as the line length divided by the wavelength of an operating frequency. In the case of a coupler in which only one line has a delay loop, the delay section has a length that equals the length of the space between the coupled sections plus the length of the delay loop.

SUMMARY

The present disclosure provides a coupled-line coupler having a coil in one of the coupled lines. In some embodiments, a coupled-line coupler may include first and second conductors having at least first and second coupled sections in which the first and second conductors are closely coupled. A coil extending around an axis may be formed in the first conductor. At least a portion of the coil may be between the first and second coupled sections. A first portion of the first conductor may cross over a second portion of the first conductor when viewed along the axis. At least a first capacitor may be connected between a circuit ground and the first conductor at a position of the coil between and spaced from the first and second coupled sections.

In some embodiments, a coupled-line coupler may include a first conductor extending between first and second ports in a first coil disposed partially in a plane. At least a first capacitor may be connected between an intermediate position of the coil and a circuit ground. A second conductor may extend between third and fourth ports spaced from the first conductor. The second conductor intermediate the third and fourth ports may not extend in a second coil. The second conductor may include a first section closely coupled to a first section of the first coil, and may include a second section closely coupled to a second section of the first coil.

In some embodiments, a coupled-line coupler may include a first conductor extending between first and second ports in a first coil disposed partially in a plane. The first coil may include at least a center full turn and a partial turn between the full turn and each port. At least a first capacitor may be connected between a central position of the coil and a circuit ground. A second conductor may extend between third and fourth ports along a straight line spaced from the first conductor. The second conductor intermediate the third and fourth ports may include a first section closely coupled to a first section of the central full turn of the first coil. The second conductor may also include a second section closely coupled to a second section of the first coil. The central position of the coil may be disposed between the first and second sections of the second conductor.

Features, functions, and advantages may be achieved independently in various embodiments of the coupled-line coupler, or may be combined in yet other embodiments, further details of which can be seen with reference to the following description and drawings.

DESCRIPTION

Overview

Various embodiments of a coupled-line coupler having first and second coupled conductors, with one of the conductors configured to include a coil, are described below and illustrated in the associated drawings. Unless otherwise specified, a coupled-line coupler and/or its various components may, but are not required to, contain at least one of the structure, components, functionality, and/or variations described, illustrated, and/or incorporated herein. The following description of various embodiments is merely exemplary in nature and is in no way intended to limit the disclosure, its application, or uses. Additionally, the advantages provided by the embodiments, as described below, are illustrative in nature and not all embodiments provide the same advantages or the same degree of advantages.

Definition

As used herein, when two conductors are stated to be coupled, this means that they are what is referred to conventionally as closely coupled or tightly coupled. In most applications, two lines that have less than 20 dB inductive coupling between them are considered to be uncoupled lines, and are coupled lines otherwise. In some applications, lines that have less than 100 dB are considered to be uncoupled lines. In terms of a coupling coefficient, two lines may be considered to be closely coupled if the coupling coefficient is 0.1 or greater. Thus, two lines may be considered as loosely coupled or substantially uncoupled if they have a coupling coefficient of less than 0.1.

EXAMPLES, COMPONENTS, AND ALTERNATIVES

The following sections describe selected aspects of exemplary coupled-line couplers. The examples in these sections are intended for illustration and should not be interpreted as limiting the entire scope of the concepts included. Each section may include one or more distinct inventions, and/or contextual or related information, function, and/or structure.

Example 1

Figure 1:
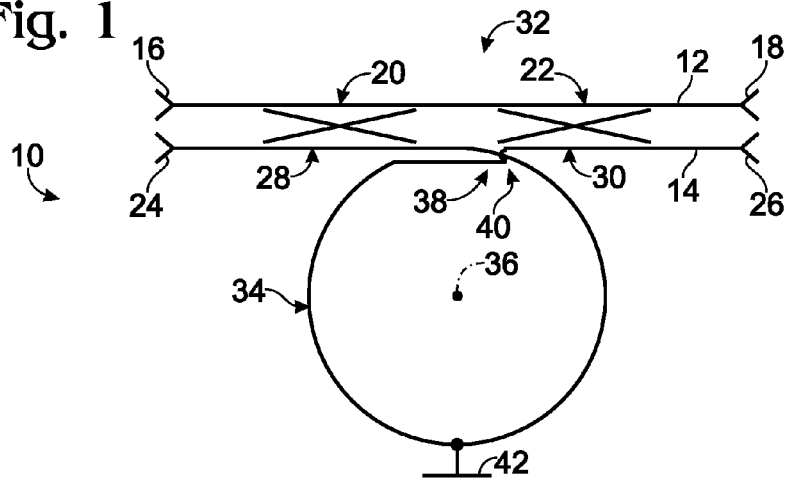
FIG. 1 is a circuit schematic of a first example of a coupled-line coupler.

A first example of a coupled-line coupler is shown generally at 10 in FIG. 1. Coupled-line coupler 10 includes a first conductor 12 and a second conductor 14. Conductor 12 extends between opposite ports 16, 18, and has a first coupled section 20 and a second coupled section 22 disposed intermediate between the two ports. Similarly, conductor 14 extends between respective opposite ports 24, 26, and has a first coupled section 28 and a second coupled section 30 disposed intermediate between ports 24, 26. Ports 16, 18, 24, 26 correspond to ports of a conventional coupler. Thus, in one application, if port 16 is applied as an input port, then port 18 is the direct or transmitted port. Port 24, then, is the coupled port and port 26 is the isolated port. As shown, coupled-line coupler 10 is symmetrical and the port designations of 16 and 18, and of 24 and 26 may be reversed. The ports may or may not be circuit terminals, and are equivalent to circuit nodes which are simply locations on the conductors where the characteristics of the coupler may be defined, whether or not those locations are accessible in a particular application.

In some examples, a coupled-line coupler may include additional conductors and may include additional coupled sections. First coupled sections 20, 28 of conductors 12, 14 are closely coupled and sections 22, 30 of conductors 12, 14 are also closely coupled. Coupled sections 20, 22 of first conductor 12 may be spaced apart or may be contiguous. In the case in which they are contiguous, coupled sections 16, 18 may form a combined coupled section 32.

In this example, conductor 14 extends in a coil 34 extending around an axis 36. At least a portion of coil 34 is disposed between the first and second coupled sections 20, 22 of conductor 14. Coil 34 forms a full turn with a first portion 38 of conductor 14 crossing over a second portion 40 of conductor 14 when viewed along axis 36, such as when viewed in a plane normal to axis 36 as shown in FIG. 1. Coil 34 may be more than one complete turn of conductor 14. As is also shown, in this example coupled sections 20, 22 of conductor 12 extend along a common line represented by the conductor and no coil exists in conductor 12 between ports 16, 18.

At least a first capacitor 42 is connected between a circuit ground 44 and second conductor 14 at an intermediate position of coil 26 between and spaced from first and second coupled sections 28, 30. In this example, capacitor 42 is connected to conductor 14 at a central position of coil 34. Coil 34 adds inductance to signals on conductor 14 and capacitor 42 directly adds capacitance to circuit ground, giving conductor 14 characteristics of a transmission line.

Example 2

Figure 2:
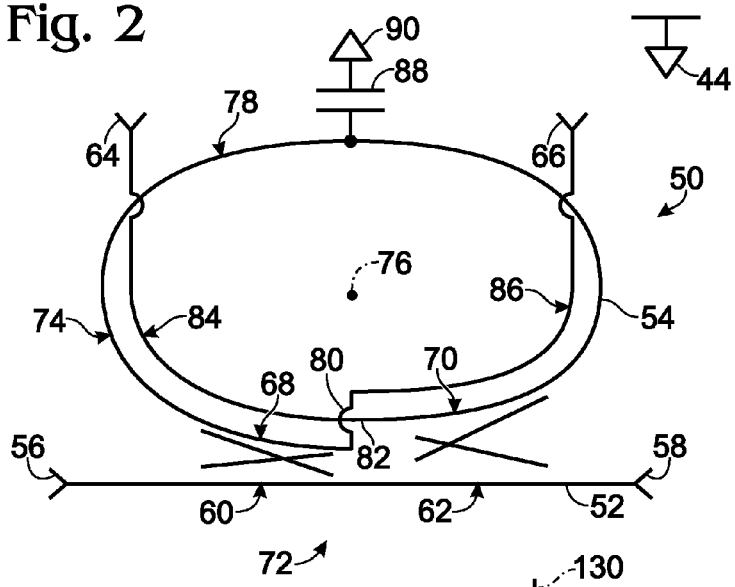
FIG. 2 is a circuit schematic of a second example of a coupled-line coupler.

A second example of a coupled-line coupler is shown generally at 50 in FIG. 2. Coupled-line coupler 50 is an example of a coupled-line coupler 10. Similar to coupled-line coupler 10, coupled-line coupler 50 includes a first conductor 52 and a second conductor 54. Conductor 52 extends between opposite ports 56, 58, and has a first coupled section 60 and a second coupled section 62 disposed intermediate between the two ports. Conductor 54 extends between respective opposite ports 64, 66, and has a first coupled section 68 and a second coupled section 70 disposed intermediate between ports 64, 66. Ports 56, 58, 64, 66 correspond to input, direct, coupled, and isolated ports of a conventional coupler. Coupled-line coupler 50 is symmetrical and the port designations may be reversed.

First coupled sections 60, 68 of respective conductors 52, 54 are closely coupled and sections 62, 70 of conductors 52, 54 are also closely coupled. Coupled sections 60, 62 of first conductor 52 may be spaced apart or may be contiguous, in which case they may be considered to form a combined coupled section 72. Coupled sections 60, 62 of conductor 52 extend along a common line represented by the conductor and no coil exists in conductor 52 between ports 56, 58.

Conductor 54 extends in a coil 74 around an axis 76. At least a portion of coil 74 is disposed between the first and second coupled sections 68, 70 of conductor 54. Coil 74 forms a full turn 78 and includes coupled sections 68, 70 with a first portion 80 of conductor 54 crossing over a second portion 82 of conductor 54 when viewed along axis 76, such as when viewed in a plane normal to axis 76 as shown in FIG. 2. When viewed from an opposite direction conductor portion 82 crosses over conductor portion 80. As viewed in FIG. 2, coupled section 68 is proximate to conductor portion 80 and coupled section 70 is proximate to conductor portion 82.

Coil 74 may be more than one complete turn of conductor 54. In this example, coil 74 forms more than 1.5 turns. A partial turn 84 of coil 74 extends from turn 78 and coupled section 70 toward port 64. Similarly, a partial turn 86 of coil 74 extends from turn 78 and coupled section 68 toward port 66.

At least a first capacitor 88 is connected between a circuit ground 90 and second conductor 54 at an intermediate position of coil 74 between and spaced from first and second coupled sections 68, 70. In this example, capacitor 88 is connected to conductor 54 at a central position of coil 74.

Example 3

Figure 3:
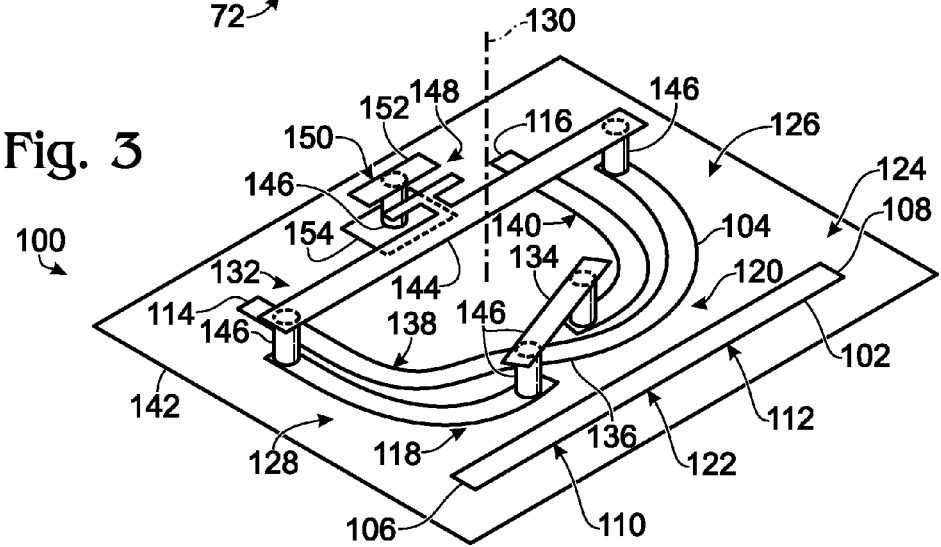
FIG. 3 is an isometric view of planar conductors of a third example of a coupled-line coupler.

A third example of a coupled-line coupler is shown generally at 100 in FIG. 3. Coupled-line coupler 100 is an example of a coupled-line coupler 10 or 50. Similar to coupled-line coupler 50, coupled-line coupler 50 includes a first conductor 102 and a second conductor 104. Conductor 102 extends between opposite ports 106, 108, and has a first coupled section 110 and a second coupled section 112 disposed intermediate between the two ports. Conductor 104 extends between respective opposite ports 114, 116, and has a first coupled section 118 and a second coupled section 120 disposed intermediate between ports 114, 116. Ports 106, 108, 114, 116 correspond to input, direct, coupled, and isolated ports of a conventional coupler. Coupled-line coupler 110 is symmetrical and the port designations may be reversed.

First coupled sections 110, 118 of respective conductors 102, 104 are closely coupled and sections 112, 120 of conductors 102, 104 are also closely coupled. Coupled sections 110, 112 of first conductor 102 may be spaced apart or may be contiguous, in which case they may be considered to form a combined coupled section 122. Coupled sections 110, 112 of conductor 102 extend along a straight line represented by the conductor and no coil exists in conductor 102 between ports 170, 172.

In this example, conductors 102 and 104 are signal conductors of respective striplines 124, 126. Signal-return conductors of striplines 124, 126 are not shown for clarity.

Conductor 104 extends in a coil 128 around an axis 130. At least a portion of coil 128 is disposed between the first and second coupled sections 118, 120 of conductor 104. Coil 128 forms a full turn 132 and includes coupled sections 118, 120 with a first portion 134 of conductor 104 crossing over a second portion 136 of conductor 104 when viewed along axis 130, such as when viewed in a plane normal to axis 130. When viewed from an opposite direction conductor portion 136 crosses over conductor portion 134. As viewed in FIG. 3, coupled section 118 is proximate to conductor portion 134 and coupled section 120 is proximate to conductor portion 136.

Coil 128 may be more than one complete turn of conductor 104. In this example, coil 128 forms more than 1.5 turns. A partial turn 138 of coil 128 extends from turn 132 and coupled section 120 toward port 114. Similarly, a partial turn 140 of coil 128 extends from turn 132 and coupled section 118 toward port 116.

Conductors 102 and 104 are planar conductors. Conductor 102 and a portion of conductor 104 are coplanar and are disposed on a first level corresponding to the planar surface of a common dielectric substrate 142. Cross-over portion 134 of conductor 104 is on a second level spaced from the first level by a second dielectric substrate, not shown. A bridge portion 144 of coil 128 also extends along the second level. Respective ends of cross-over portion 134 and bridge portion 144 are connected to corresponding portions of coil 128 on the first level by conductive vias 146, as shown. In this configuration, conductor 102 is positioned to one side of and proximate to coil 128 opposite from axis 130.

At least a first capacitor 148 is connected between a circuit ground 150 and conductor 104 at an intermediate position, such as a central position, of coil 128 between and spaced from first and second coupled sections 118, 120. Circuit ground 150 is in the form of a planar conductive pad 152 coplanar with bridge portion 144 of coil 128. Conductive pad 152 is connected to a grounded conductive pad 154 on the surface of dielectric substrate 142 by a via 146. Capacitor 148 providing capacitance to ground may be sized as appropriate for a given application.

Example 4

Figure 4:
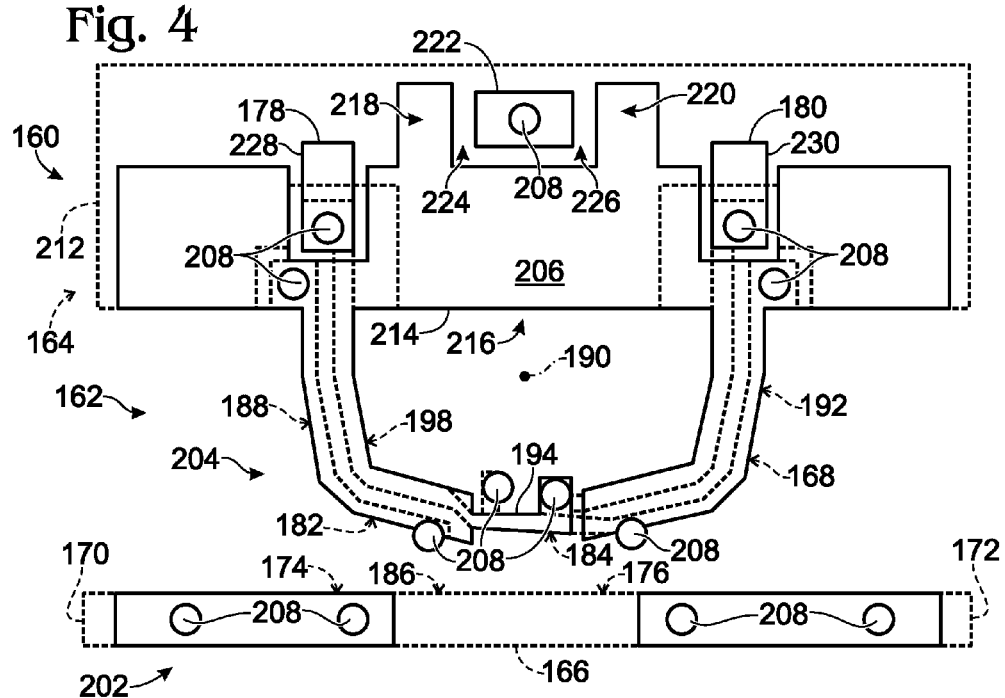
FIG. 4 is a plan view of a fourth example of a strip-line coupled-line coupler as viewed in a plane of an outer conductor layer.
Figure 5:
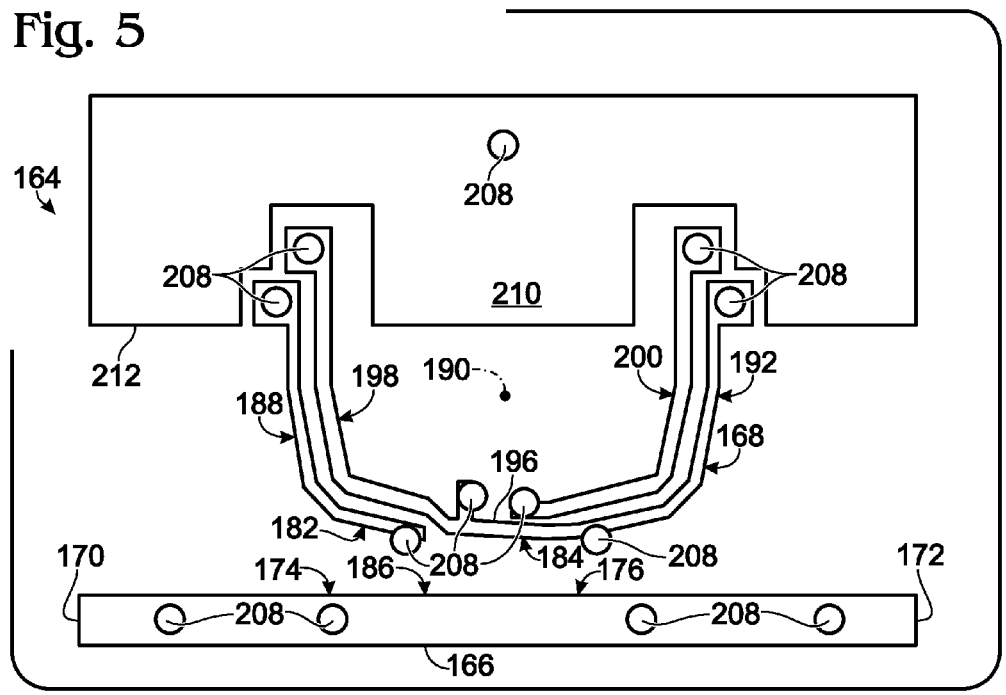
FIG. 5 is a plan view of the fourth example of a strip-line coupled-line coupler as viewed in a plan containing an intermediate conductor layer.

FIGS. 4 and 5 illustrate more detailed views of two metallization layers of a strip-line coupled-line coupler 160 that is an example of a variation of coupled-line coupler 100. FIG. 4 is a plan view of a first outer conductive layer 162. A second outer conductive layer, not shown, has substantially the same configuration as first outer conductive layer 162. A middle or intermediate conductive layer 164, shown in dashed lines in FIG. 4, is shown in FIG. 5. Interconnections shown between middle conductive layer 164 and first outer conductive layer 162 also exists between the middle conductive layer and the second outer conductive layer, resulting in a strip-line form of transmission-line structure for coupled-line coupler 160.

Coupled-line coupler 160 is substantially similar to coupled-line coupler 100. Coupled-line coupler 160 includes a first conductor 166 and a second conductor 168. Conductor 166 extends between opposite ports 170, 172, and has a first coupled section 174 and a second coupled section 176 disposed intermediate between the two ports. Conductor 168 extends between respective opposite ports 178, 180, and has a first coupled section 182 and a second coupled section 184 disposed intermediate between ports 178, 180. Ports 170, 172, 178, 180 correspond to input, direct, coupled, and isolated ports of a conventional coupler. Coupled-line coupler 174 is symmetrical and the port designations may be reversed.

First coupled sections 174, 182 of respective conductors 166, 168 are closely coupled and sections 176, 184 of conductors 166, 168 are also closely coupled. Coupled sections 174, 176 of first conductor 166 are substantially contiguous, in which case they may be considered to form a combined coupled section 186. Coupled sections 174, 176 of conductor 166 extend along a straight line represented by the conductor and no coil exists in conductor 166 between ports 170, 172. It is seen that coupled sections 182 and 184 couple to spaced-apart portions of conductor 166, and that coupled section 182 couples to a shorter length of conductor 166 than coupled section 184. In this example, it is seen that coupled sections 174, 182 are less than half the length of coupled sections 176, 184.

Conductor 168 extends in a coil 188 around an axis 190. At least a portion of coil 188 is disposed between the first and second coupled sections 182, 184 of conductor 168. Coil 188 forms a full turn 192 and includes coupled sections 182, 184 with a first portion 194 of conductor 168 crossing over a second portion 196 of conductor 168 when viewed along axis 190, such as when viewed in a plane normal to axis 190. When viewed from an opposite direction conductor portion 196 crosses over conductor portion 194. As viewed in FIG. 4, coupled section 182 is proximate to conductor portion 194 and coupled section 184 is proximate to conductor portion 196.

Coil 188 may be more than one complete turn of conductor 168. In this example, coil 188 forms more than 1.5 turns. A partial turn 198 of coil 188 extends from turn 192 toward port 178 and includes coupled section 182. Similarly, a partial turn 200 of coil 188 extends from turn 192 toward port 180.

In this example, conductors 166 and 168 are planar signal conductors of respective striplines 202, 204. Conductor 166 and a portion of conductor 168 are coplanar and are made from middle conductive layer 164. Cross-over portion 194 of conductor 168 is made from the outer conductive layers, including outer conductive layer 162 shown in FIG. 4. A bridge portion 206 of coil 188 is made from the outer conductive layers. Respective ends of cross-over portion 194 and bridge portion 206 are connected to corresponding portions of coil 188 on the first level by conductive vias 208, as shown.

Additionally, a conductive pad 228 forming port 178 connects thru a via 208 to partial turn 198 on middle conductive layer 164. Partial turn 198 connects to turn 192 at conductor portion 196, which passes between crossover portions 194 in the outer layers. Similarly, a conductive pad 230 forming port 180 connects thru a via 208 to partial turn 200 on middle conductive layer 164. Partial turn 200 passes through another via 208 and connects to turn 192 at crossover portions 194 in the outer layers. In this configuration, conductor 166 is positioned to one side of and proximate to coil 188 opposite from axis 190.

Striplines 202, 204 are formed by the combination of middle conductive layer 164 and the two outer conductive layers including outer conductive layer 162. For portions of the striplines in which the signal conductor is formed in middle conductive layer 164, the signal-return conductor is formed by the combination of corresponding portions of the two outer conductive layers. The converse is also true. That is, for portions of the striplines in which the signal conductor is formed in the two outer conductive layers, such as bridge portion 206 in outer conductive layer 162, middle conductive layer 164 forms the signal-return conductor, such as portion 210 of middle conductive layer 164. Portion 210 is a part of a greater ground plane 212 formed from middle conductive layer 164, which is physically and electrically spaced from conductor 168.

A conductive plate 214 that includes bridge portion 206 is formed in outer conductive layer 162 and extends between and beyond ports 178, 180, as shown. Conductive plate 214 is disposed directly opposite from and faces ground plane 212, and forms with ground plane 212 a capacitor 216 between and spaced from first and second coupled sections 182, 184. Capacitor 216 provides capacitance to ground along a central region of coil 188 including and extending from bridge portion 206.

This example also includes optional first and second trim capacitors 218, 220 that are formed by extensions of conductive plate 214 and a circuit ground pad 222. Trim capacitor 218 is formed by a first gap 224 between conductive plate 214 and circuit ground pad 222 physically and electrically spaced from conductive plate 214. Similarly, trim capacitor 220 is formed by a second gap 226 between conductive plate 214 and circuit ground pad 222. Circuit ground pad 222 is connected to ground plane 212 by a via 208. The trim capacitors provide the opportunity to fine tune the capacitance to ground provided by capacitor 216 after manufacture of the coupled-line coupler.

Port 178 is formed as conductive pad 228 in outer conductive layer 162, which conductive pad is connected to conductor 168 on middle conductive layer 164 by an associated via 208. Similarly, port 180 is formed as a conductive pad 230 in outer conductive layer 162. Conductive pad 230 is connected to partial turn 200 of conductor 168 on middle conductive layer 164 by a via 208.

Figure 6:
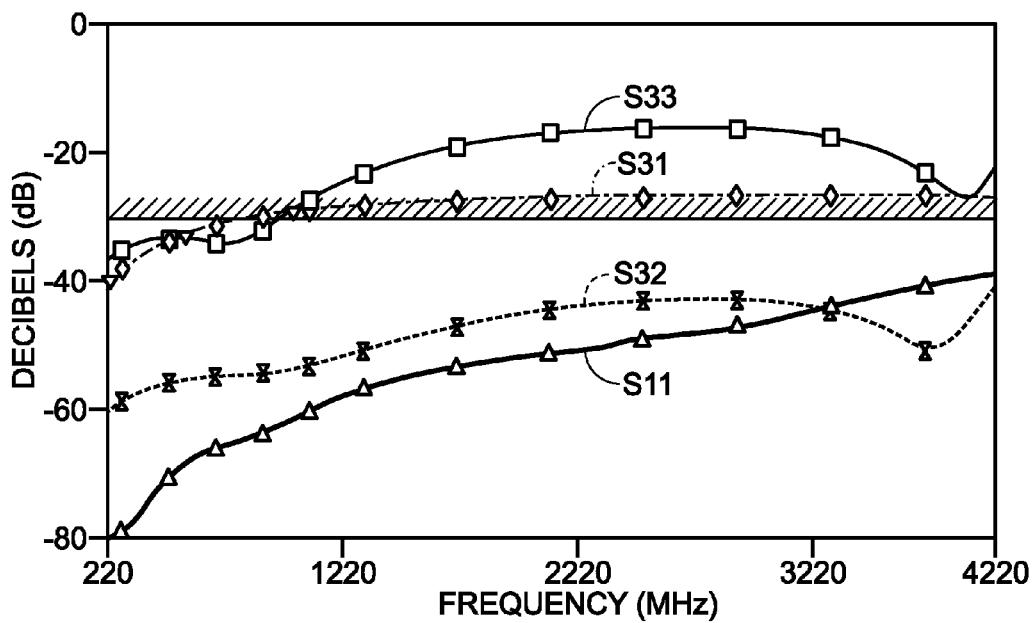
FIGS. 6-10 are graphs of representative scattering parameters of the fourth example of a strip-line coupled-line coupler.

Various simulated operating parameters over a frequency range of 220 MHz to 4220 MHz are illustrated in FIG. 6 for coupled-line coupler 160. In FIG. 6, ports 170, 172, 178, 180 of coupler 160 are identified as 1, 2, 3, and 4, respectively. The input return loss (S11) at port 170 is seen to be below −40 dB for the frequency range shown, and is below −50 dB for all but the upper end of the frequency range. The coupled-output return loss (S33) on coupled port 178 is generally below −20 dB. The coupling (S31) to the coupled port is below −25 dB. Isolation (S32) between direct output port 172 and coupled port 178 is below −45 dB for the illustrated frequency range. The simulated coupled-line coupler 160 thus provides a compact design while realizing low loss with a nominal −25 dB tap.

Figure 7:
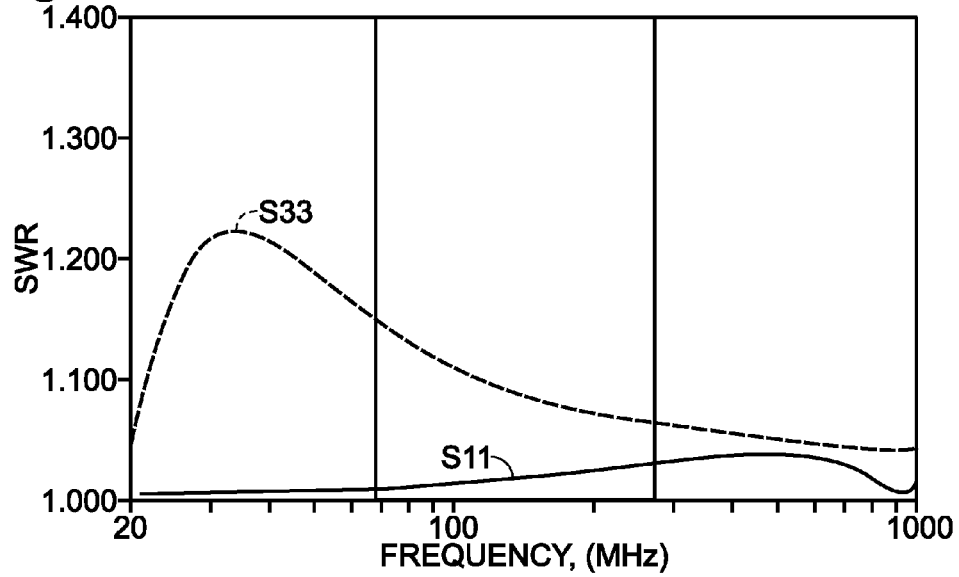

Various operating parameters measured over a frequency range of 20 MHz to 1000 MHz are illustrated in FIGS. 7-10 for a prototype of coupled-line coupler 160 having a frequency equalizer connected to the output of coupled port 178. In FIGS. 7-10, the frequencies are shown as a logarithmic frequency scale and ports 170, 172, 178, 180 of coupler 160 are identified as 1, 2, 3, and 4, respectively. In FIG. 7, the standing-wave ratio (SWR) at port 170 (S11) is seen to be below about 1.04 for the frequency range shown, with the higher amounts in the middle of the frequency band. The SWR for the coupled port 178 reaches a maximum slightly above 1.2 in the low end of the frequency band, and is progressively less with increasing frequency.

Figure 8:
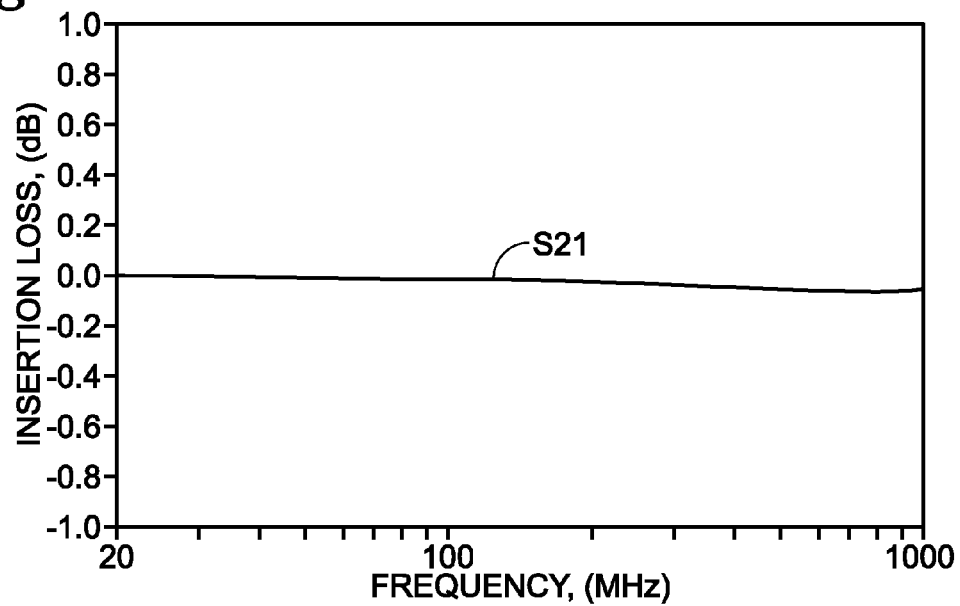
Figure 9:
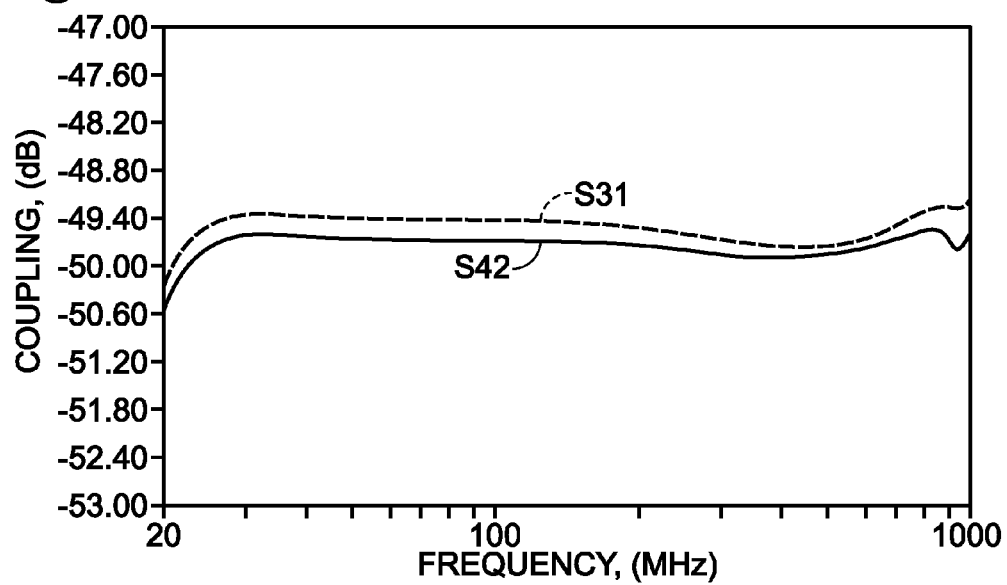
Figure 10:
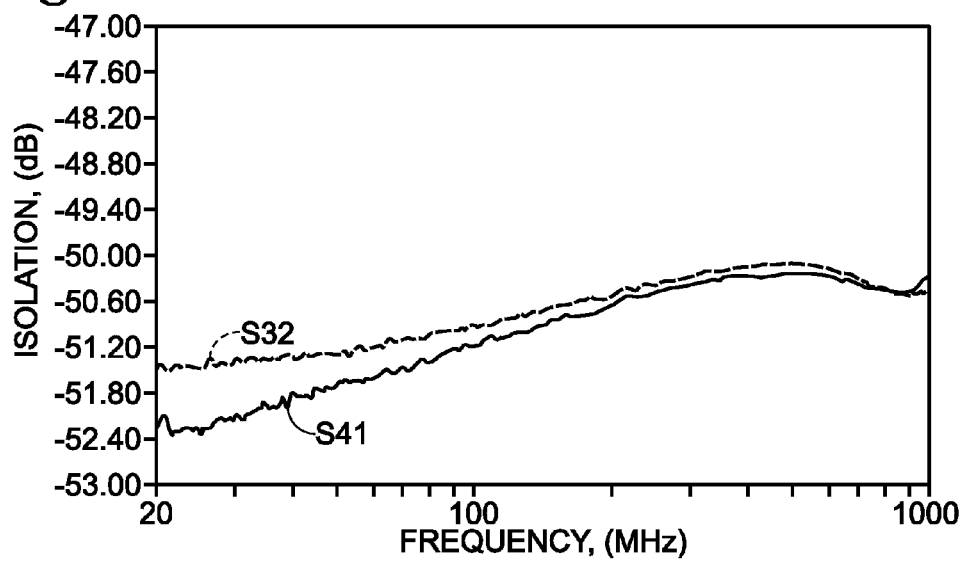

As shown in FIG. 8, the insertion loss on direct port 172 (S21) is less than about −0.07 dB over the frequency band. Moreover, as shown in FIG. 9, the coupling (S31, S42) varies less than 1.5 dB and has a value of less of than −49 dB over the frequency range. This result is obtained with an additional frequency equalizer connected between the coupler port 3 and the coupled output. Normally, such a short coupler would exhibit a variation of 25 dB over this frequency range. This reduction in coupling variation results in a greatly increased power handling capability, because less power is coupled out of the main coupling path at the highest frequencies. As shown in FIG. 10, isolation between direct output port 172 and coupled port 178 (S32, S41) is below −50 dB for the illustrated frequency range. Coupled-line coupler 160 with a coupled-output equalizer thus provides a compact design while realizing low loss with a nominal 50 dB tap with low frequency sensitivity.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. The following claims particularly point out certain combinations and subcombinations regarded as novel and nonobvious. Invention(s) embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original claims, also are regarded as included within the subject matter of the invention(s) of the present disclosure.

I claim:

1. A coupled-line coupler comprising:
   first and second conductors having at least first and second coupled sections in which the first and second conductors are closely coupled;
   a coil formed in the first conductor, the coil extending around an axis, at least a portion of the coil being between the first and second coupled sections, a first portion of the first conductor crossing over a second portion of the first conductor when viewed along the axis; and
   at least a first capacitor connected between a circuit ground and the first conductor at a position of the coil between and spaced from the first and second coupled sections;
   wherein the second conductor extends only along one side of the coil.

2. The coupled-line coupler of claim 1, wherein the first and second conductors in the first and second coupled sections are coplanar.

3. The coupled-line coupler of claim 1, wherein the second conductor extends proximate the coil distal from the axis.

4. The coupled-line coupler of claim 1, wherein the first and second coupled sections of the first conductor are disposed in the coil.

5. The coupled-line coupler of claim 4, wherein the first conductor extends between first and second ports, the coil being disposed between the first and second ports of the first conductor and the first coupled section is disposed between the first port and the at least a first capacitor and the second coupled section is disposed between the second port and the at least a first capacitor.

6. The coupled-line coupler of claim 4, wherein the first and second coupled sections of the first conductor are spaced apart by at least a full turn of the coil.

7. The coupled-line coupler of claim 1, wherein the first and second sections of the second conductor extend in a common straight line.

8. A coupled-line coupler comprising:
   a first conductor extending between first and second ports in a first coil disposed partially in a plane;
   at least a first capacitor connected between an intermediate position of the first coil and a circuit ground; and
   a second conductor extending only along one side of the first coil between third and fourth ports and spaced from the first conductor, wherein the second conductor is intermediate the third and fourth ports and does not extend in a second coil, and the second conductor includes a first section closely coupled to a first section of the first coil and a second section closely coupled to a second section of the first coil.

9. The coupled-line coupler of claim 8, wherein the second conductor extends proximate the first coil distal from an axis the first coil is wound around.

10. The coupled-line coupler of claim 8, wherein the first and second sections of the second conductor extend in a common straight line.

11. The coupled-line coupler of claim 8, wherein the first and second sections of the second conductor and the first and second sections of the first coil are coplanar.

12. The coupled-line coupler of claim 8, wherein the first and second sections of the first coil are spaced apart by at least a full turn of the first coil.

13. The coupled-line coupler of claim 8, wherein the first and second coupled sections of the first conductor are disposed in the first coil.

14. The coupled-line coupler of claim 13, wherein the first coil is disposed between the first and second ports on the first conductor, the first section of the first conductor is disposed between the first port and the at least a first capacitor, and the second section of the first conductor is disposed between the second port and the at least a first capacitor.

15. A coupled-line coupler comprising:
   a first conductor extending between first and second ports in a coil disposed partially in a plane, the coil including at least a center full turn and a partial turn between the at least a center full turn and each port;
   at least a first capacitor connected between a central portion of the coil and a circuit ground; and
   a second conductor extending between third and fourth ports along a straight line spaced from the first conductor, wherein the second conductor is intermediate the third and fourth ports and includes a first section closely coupled to a first section of the at least a center full turn of the coil, and includes a second section closely coupled to a second section of the coil, the central portion of the coil being disposed between the first and second sections of the second conductor, wherein the first and second sections of the second conductor and the first and second sections of the coil are coplanar.

16. The coupled-line coupler of claim 15, wherein the first and second sections of the second conductor are contiguous.

17. A coupled-line coupler comprising:
   first and second conductors having at least first and second coupled sections in which the first and second conductors are closely coupled;
   a coil formed in the first conductor, the coil extending around an axis, at least a portion of the coil being between the first and second coupled sections, a first portion of the first conductor crossing over a second portion of the first conductor when viewed along the axis; and
   at least a first capacitor connected between a circuit ground and the first conductor at a position of the coil between and spaced from the first and second coupled sections;
   wherein the second conductor does not extend in a second coil along and between the first and second coupled sections.

18. The coupled-line coupler of claim 17, wherein the first and second conductors in the first and second coupled sections are coplanar.

19. The coupled-line coupler of claim 17, wherein the first and second sections of the second conductor extend in a common straight line.

20. The coupled-line coupler of claim 17, wherein the second conductor extends only along one side of the coil.

21. The coupled-line coupler of claim 17, wherein the second conductor extends proximate the coil distal from the axis.

22. The coupled-line coupler of claim 17, wherein the first and second coupled sections of the first conductor are disposed in the coil.

23. The coupled-line coupler of claim 22, wherein the first conductor extends between first and second ports, the coil being disposed between the first and second ports of the first conductor and the first coupled section is disposed between the first port and the at least a first capacitor and the second coupled section is disposed between the second port and the at least a first capacitor.

24. The coupled-line coupler of claim 22, wherein the first and second coupled sections of the first conductor are spaced apart by at least a full turn of the coil.

\* \* \* \* \*